United States Patent
Huang et al.

(10) Patent No.: US 12,387,970 B2
(45) Date of Patent: *Aug. 12, 2025

(54) SINGLE WAFER SPIN CLEANING APPARATUS WITH SOAKING, CLEANING, AND ETCHING FUNCTIONS

(71) Applicant: GRAND PROCESS TECHNOLOGY CORP., Hsinchu (TW)

(72) Inventors: Li-tso Huang, Hsinchu (TW); Hsiu-kai Chang, Hsinchu (TW); Chin-yuan Wu, Hsinchu (TW); Ming-che Hsu, Hsinchu (TW)

(73) Assignee: GRAND PROCESS TEHCNOLOGY CORP., Hsinchu (TW)

( * ) Notice: Subject to any disclaimer, the term of this patent is extended or adjusted under 35 U.S.C. 154(b) by 364 days.

This patent is subject to a terminal disclaimer.

(21) Appl. No.: 18/104,976

(22) Filed: Feb. 2, 2023

(65) Prior Publication Data

US 2024/0145292 A1 May 2, 2024

(30) Foreign Application Priority Data

Oct. 31, 2022 (TW) .................................. 111141469

(51) Int. Cl.
| | |
|---|---|
| *B08B 3/04* | (2006.01) |
| *B08B 3/02* | (2006.01) |
| *H01L 21/67* | (2006.01) |
| *H01L 21/683* | (2006.01) |
| *H01L 21/687* | (2006.01) |

(52) U.S. Cl.
CPC ........ *H01L 21/68764* (2013.01); *B08B 3/022* (2013.01); *B08B 3/04* (2013.01); *H01L 21/67051* (2013.01); *H01L 21/6838* (2013.01); *H01L 21/68735* (2013.01); *H01L 21/68742* (2013.01)

(58) Field of Classification Search
None
See application file for complete search history.

(56) References Cited

U.S. PATENT DOCUMENTS

| | | | | |
|---|---|---|---|---|
| 5,608,943 | A * | 3/1997 | Konishi | ............ H01L 21/67051 15/302 |
| 12,128,452 | B2 * | 10/2024 | Huang | .................... B08B 3/022 |
| 2005/0260345 | A1 * | 11/2005 | Lubomirsky | ....... C23C 18/1619 118/52 |

* cited by examiner

*Primary Examiner* — Cristi J Tate-Sims
(74) *Attorney, Agent, or Firm* — The Roy Gross Law Firm, LLC; Roy D. Gross

(57) ABSTRACT

A single wafer spin cleaning apparatus with soaking, cleaning, and etching functions in accordance with the present invention includes a spin driver device, a wafer spin chuck, and a wafer support disk. The wafer spin chuck is driven by the spin driver device to spin. The wafer support disk is annular and surrounds the wafer spin chuck, can act relative to the wafer spin chuck to a wafer support position or a wafer disengagement position, and includes a soaking trough. The wafer support disk at the wafer support position can support a wafer such that the wafer is soaked in processing liquid injected in the soaking trough for implementing a high efficient cleaning or etching process.

14 Claims, 8 Drawing Sheets

SINGLE WAFER SPIN CLEANING APPARATUS WITH SOAKING, CLEANING, AND ETCHING FUNCTIONS

CROSS REFERENCE TO RELATED APPLICATIONS

This application claims the benefit of priority of Taiwanese Patent Application No. 111141469, filed Oct. 31, 2022, the contents of which are all incorporated herein by reference in their entirety.

FIELD OF INVENTION

The present invention relates to a wafer cleaning apparatus, especially to a single wafer spin cleaning apparatus with soaking, cleaning, and etching functions.

BACKGROUND OF INVENTION

A conventional cleaning process requires the wafer surface to be soaked in chemical solution for a sufficient time to generate effective chemical cleaning reaction. A general semiconductor single wafer spin cleaning apparatus cannot implement a soaking process on a wafer spin chuck such that it is required to implement a soaking cleaning process to a wafer in an exclusive soaking tank to make solution chemically react with the wafer sufficiently for implementation of an initial cleaning process. Then, the initially cleaned wafer is transported to a single wafer spin clean chamber by a transfer robot for implementation of the subsequent processes of wafer spin cleaning and spin drying.

Completing the above cleaning steps requires placing the wafer in different devices respectively which makes the entire cleaning process complicated and increases processing time and production costs.

Therefore, the current wafer cleaning process urgently requires a single wafer cleaning apparatus able to complete the above complicated cleaning steps and incorporate multiple cleaning steps therein to improve the process efficiency and reduce the production costs.

SUMMARY OF INVENTION

A main objective of the present invention is to provide a single wafer spin cleaning apparatus with soaking, cleaning, and etching functions disposing a wafer support disk around a periphery of a wafer spin chuck. The wafer support disk can ascend and descend relative to the wafer spin chuck, and set the wafer in the soaking trough in the wafer support disk when wafer support disk is in an ascending position to achieve a goal of sufficiently soaking the wafer in a solution.

To achieve the above objective, the present invention provides a single wafer spin cleaning apparatus with soaking, cleaning, and etching functions, comprising:
 a spin driver device;
 a wafer spin chuck connected to the spin driver device, driven by the spin driver device to spin, and configured to fasten a wafer placed on a top surface of the wafer spin chuck; and
 a wafer support disk, being annular, surrounding an outer side of the wafer spin chuck, and configured to ascend to a wafer supporting position relative to the wafer spin chuck or descend to a wafer separation position relative to the wafer spin chuck, wherein the wafer support disk comprises a base disk portion and an outer annular wall portion protruding out from an outer edge of the base disk portion, a soaking trough is formed between the base disk portion and the outer annular wall portion and is configured to accommodate the wafer, and an accommodation hole is formed through the wafer support disk and communicate with the soaking trough for the wafer spin chuck entering and exiting out of the accommodation hole;
 wherein when the wafer support disk ascends to the wafer supporting position, a wafer contact top surface of the base disk portion is flush with the top surface of the wafer spin chuck; when the wafer support disk descends to the wafer separation position, the wafer contact top surface of the base disk portion is lower than the top surface of the wafer spin chuck.

In a preferred embodiment of the present invention, a liquid collection trough is formed in the wafer contact top surface of the base disk portion of the wafer support disk, and the liquid collection trough is located below the soaking trough and communicates with the soaking trough.

In a preferred embodiment of the present invention, the liquid collection trough is annular, and an inner annular wall portion is formed on the base disk portion between the liquid collection trough and the accommodation hole.

In a preferred embodiment of the present invention, a top end of the inner annular wall portion is flush with the wafer contact top surface.

In a preferred embodiment of the present invention, the liquid collection trough and the outer annular wall portion are at an interval.

In a preferred embodiment of the present invention, at least one liquid discharge hole is formed through the base disk portion and communicates with the liquid collection trough.

In a preferred embodiment of the present invention, a discharge pipe protrudes from and is formed on a bottom surface of the base disk portion and corresponds to the liquid discharge hole.

In a preferred embodiment of the present invention, the wafer contact top surface of the base disk portion is a flat surface.

In a preferred embodiment of the present invention, a vacuum pump connection port is disposed on the spin driver device, a vacuum suction hole is formed through the wafer spin chuck and communicates with the vacuum pump connection port, and the vacuum suction hole is configured to secure the wafer on the wafer spin chuck.

In a preferred embodiment of the present invention, at least one liquid nozzle is disposed on the outer annular wall portion of the wafer support disk and extends into the soaking trough.

In a preferred embodiment of the present invention, the wafer support disk is connected to a lifting drive mechanism, and the lifting drive mechanism is configured to drive the wafer support disk to ascend or descend relative to the wafer spin chuck.

In a preferred embodiment of the present invention, the wafer spin chuck is connected to a lifting drive mechanism, and the lifting drive mechanism is configured to drive the wafer spin chuck relative to the wafer support disk.

In a preferred embodiment of the present invention, the lifting drive mechanism is secured on the spin driver device.

In a preferred embodiment of the present invention, the lifting drive mechanism is one of a pneumatic cylinder, a hydraulic cylinder, an electromagnetic valve, and a motor.

In a preferred embodiment of the present invention, the spin driver device comprises a motor, the motor is connected to the wafer spin chuck by a spin shaft and is configured to drive the wafer spin chuck to spin.

The single wafer spin cleaning apparatus with soaking, cleaning, and etching functions of the present invention at least comprises advantages as follows:

1. The single wafer spin cleaning apparatus with soaking, cleaning, and etching functions of the present invention disposes a wafer support disk surrounding a periphery of a wafer spin chuck. The wafer support disk is annular and can accommodate a wafer spin chuck, an outer edge of the wafer support disk is a protruding outer annular wall portion. When the wafer support disk ascends to the wafer supporting position and is at the same level with the wafer spin chuck, the wafer support disk exactly tightly supports and surrounds a side surface and a bottom portion of the wafer and makes the wafer seal an accommodation hole in a center of the wafer support disk such that a solution sprayed on the wafer can keep a liquid level in the soaking trough without leaking out from the accommodation hole, and therefore to make the solution to perform a sufficiently soaking effect to the wafer in the soaking trough.

2. After the above soaking step is completed, the wafer support disk can descend to the wafer separation position such that the wafer rises relative to the wafer support disk to make the solution flow into the liquid collection trough of the wafer support disk, and is further discharged from the liquid discharge hole. Alternatively, the accommodation hole can also be designed to have liquid guide and drainage effects. After the wafer support disk descends to the wafer separation position, the spin driver device can drive the wafer spin chuck and the wafer secured on the wafer spin chuck by the vacuum suction force to perform the subsequent cleaning and spin drying steps to achieve spin cleaning and drying effects to the wafer.

3. According to demands of wafer processes, the solution injected from the process nozzle above the wafer onto the wafer in the soaking trough can be a cleaning solution or an etching solution, and can be deionized Water. When the solution is an etching (or a cleaning) solution, the wafer support disk at the wafer supporting position can keep a liquid level of the etching (or a cleaning) solution such that the etching (or a cleaning) solution sufficiently performs the etching (or cleaning) effect. After etching (or a cleaning) step is completed, the wafer support disk descends again to the wafer separation position such that the etching solution can be discharged out from the wafer support disk.

4. It is known according to the above three points that the wafer spin cleaning apparatus of the present invention can be performed with continuous single wafer soaking, spin cleaning, etching, and spin drying processes on the same wafer spin chuck. Therefore, the present invention can effectively prevent an issue of the above continuous processes requiring a transfer robot to steadily move wafer to independent apparatuses to implement corresponding steps to further simplify wafer cleaning or etching process, reduce the wafer damaging due to frequent wafer transfer, and further improve efficiency and yield of the wafer process.

DETAILED DESCRIPTION OF PREFERRED EMBODIMENTS

Figure 1:
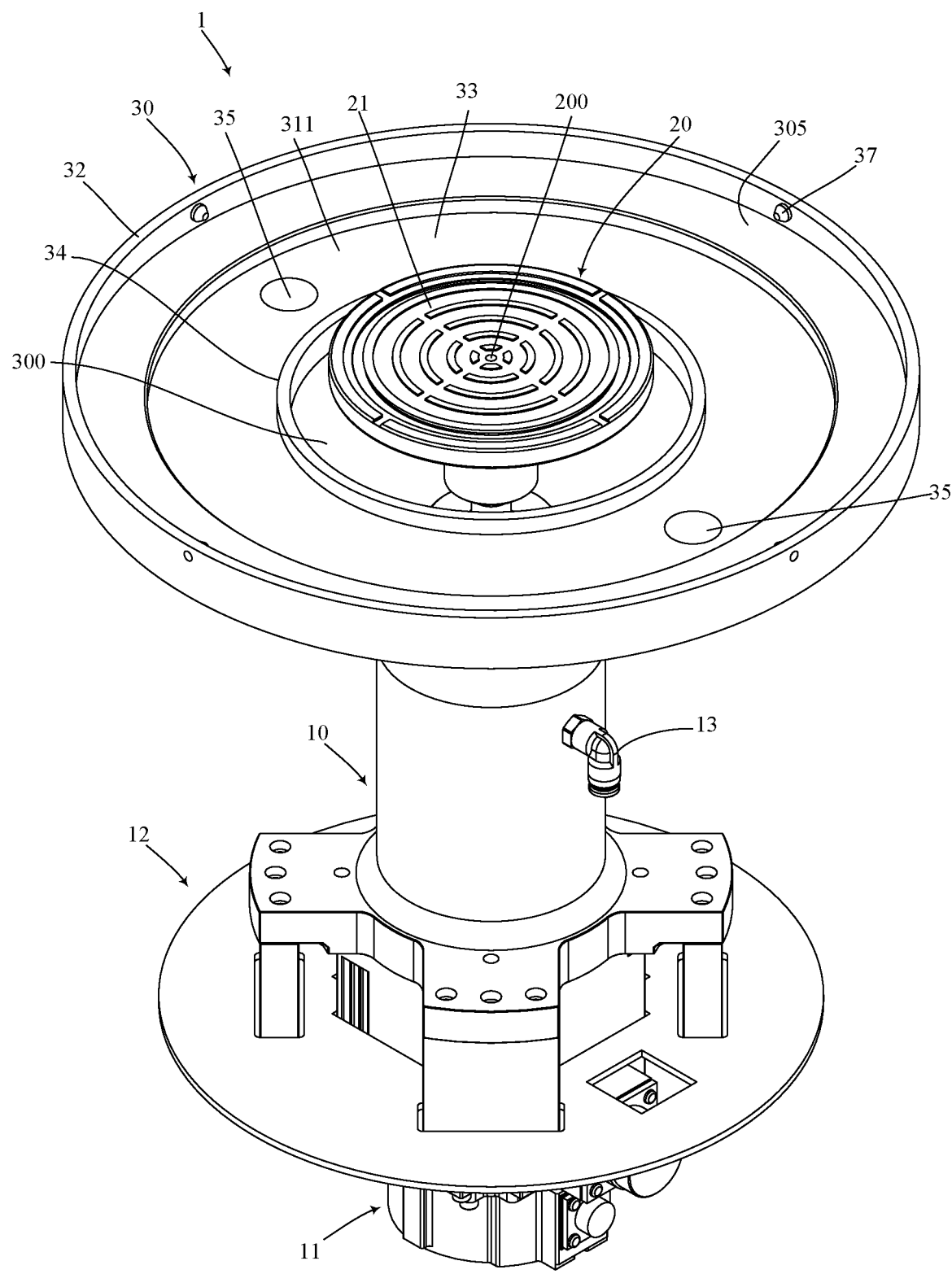
FIG. 1 is a perspective view of the single wafer spin cleaning apparatus with soaking, cleaning, and etching functions of the present invention.
Figure 2:
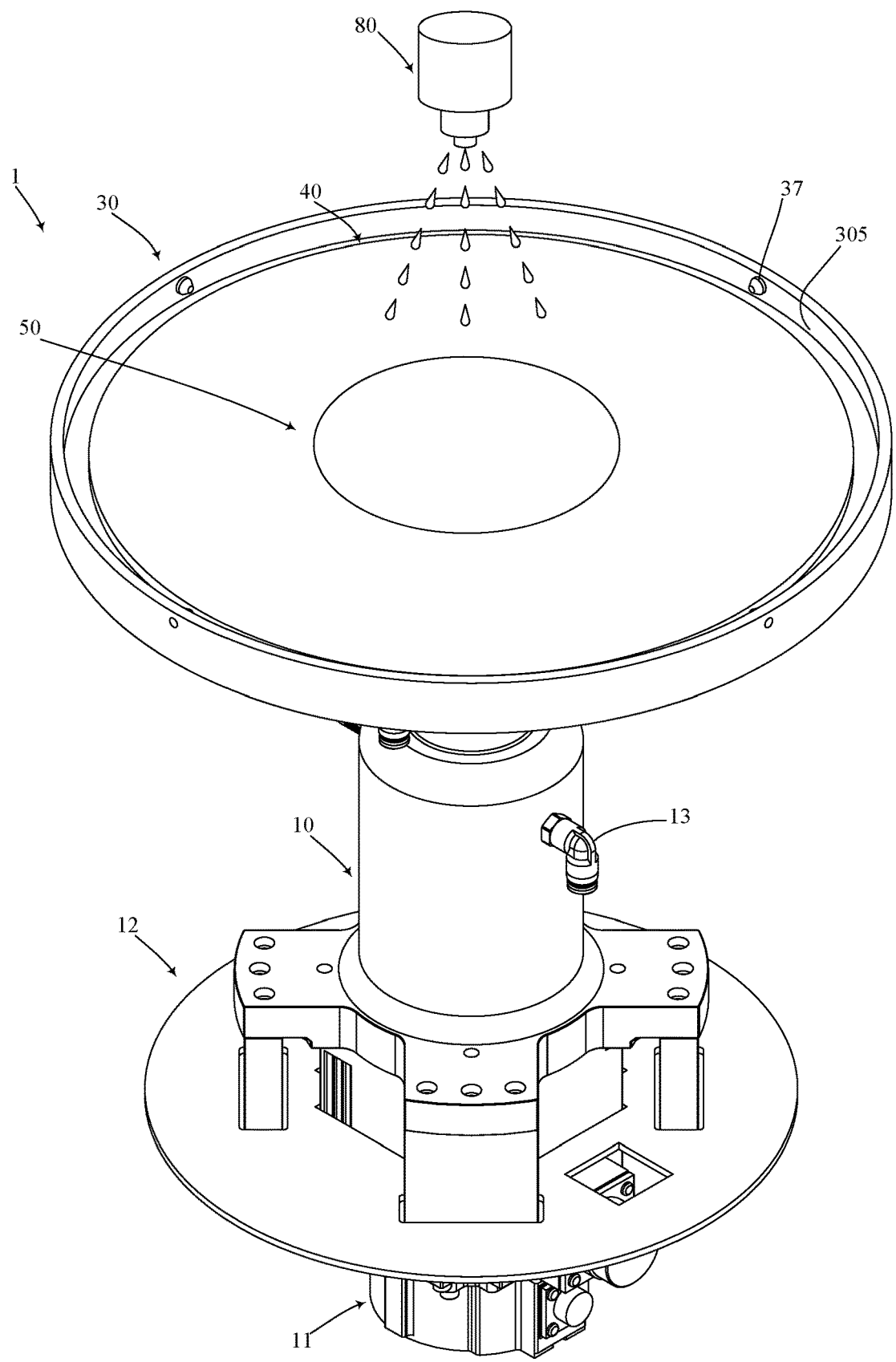
FIG. 2 is a perspective view of a wafer and a solution placed on the wafer spin cleaning apparatus of the present invention, wherein a process nozzle is set above the wafer spin cleaning apparatus.
Figure 3:
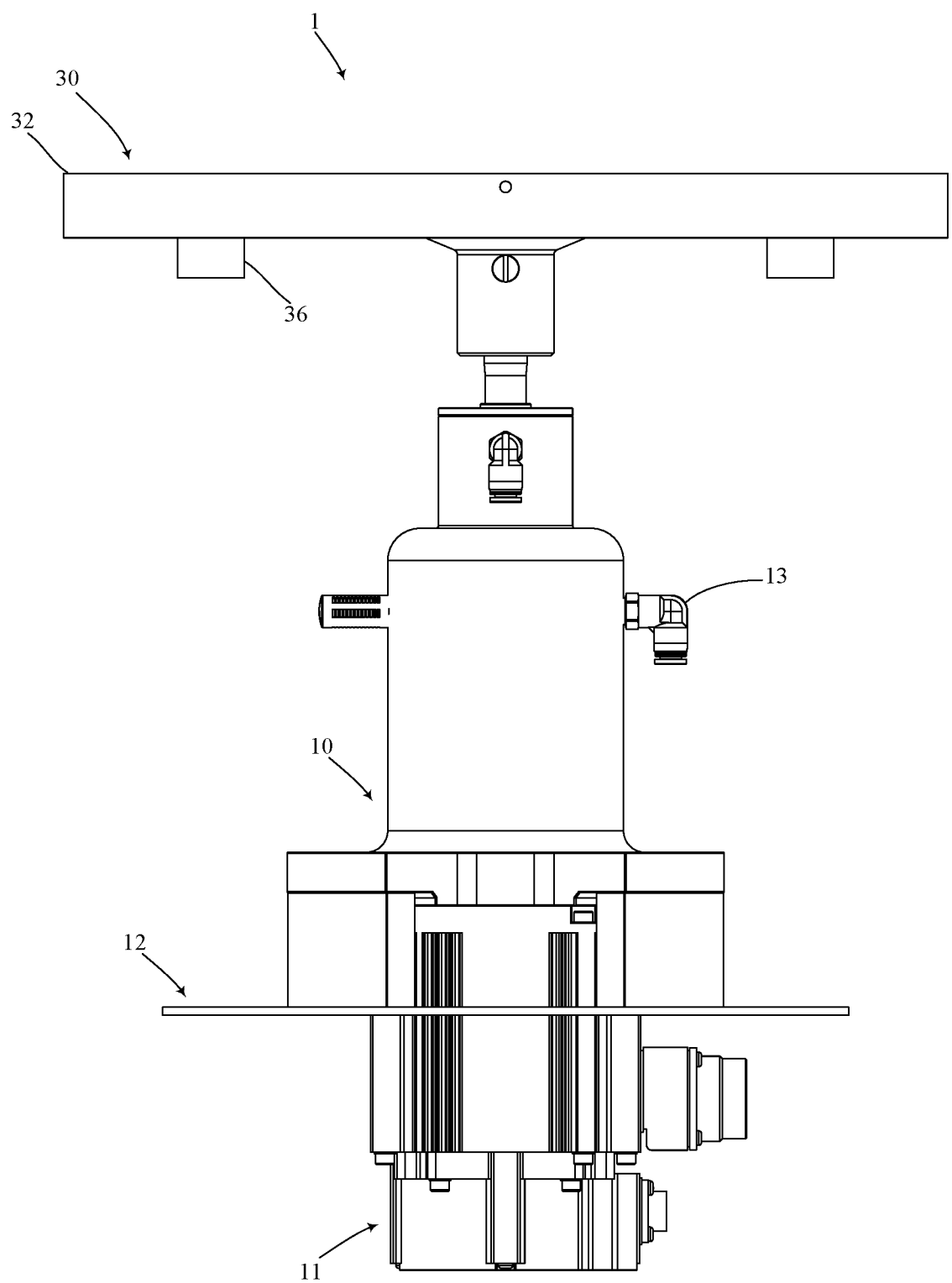
FIG. 3 is a side view of the wafer spin cleaning apparatus of the present invention.

With reference to FIGS. 1 to 3, a single wafer spin cleaning apparatus 1 with soaking, cleaning, and etching functions of the present invention comprises: a spin driver device 10, a wafer spin chuck 20, and a wafer support disk 30.

The wafer spin chuck 20 is connected to the spin driver device 10, is driven by the spin driver device 10 to spin, and is configured to secure a wafer 40 placed on a top surface 21 of the wafer spin chuck 20.

The wafer support disk 30 is annular and surrounds an outer side of the wafer spin chuck 20, and is configured to ascend relative to the wafer spin chuck 20 to a wafer supporting position or to descend relative to the wafer spin chuck 20 to a wafer separation position. The wafer support disk 30 comprises a base disk portion 31 and an outer annular wall portion 32 protruding from an outer edge of the base disk portion 31. A soaking trough 305 is formed between the base disk portion 31 and the outer annular wall portion 32 and is configured to accommodate the wafer 40. The soaking trough 305 can be poured with a solution 50 or pure water by a process nozzle 80 located above the wafer spin chuck 20 such that the solution 50 is coated on the wafer 40 to implement a cleaning or etching process. An accommodation hole 300 is formed through the wafer support disk 30 and communicates with the soaking trough 305 such that the wafer spin chuck 20 can enter and exit out of the accommodation hole 300. Furthermore, the above solution 50 poured into the soaking trough 305 can be a cleaning solution 50 or an etching solution 50 depending on demands of the wafer process. Furthermore, the above process nozzle 80 is usually a main device for spraying the solution 50 or pure water, can be connected to a solution or pure water storage tank, and is configured to perform spraying the solution 50 or pure water during the soaking and spin cleaning steps to the wafer 40.

When the wafer support disk 30 ascends to the wafer supporting position, a wafer contact top surface 311 of the base disk portion 31 is flush with the top surface 21 of the wafer spin chuck 20. When the wafer support disk 30 descends to the wafer separation position, the wafer contact top surface 311 of the base disk portion 31 is lower than the top surface 21 of the wafer spin chuck 20.

In particular, the wafer supporting position is higher than the wafer separation position. When the wafer support disk 30 is at the wafer supporting position, the base disk portion 31 can tightly contact a bottom portion of the wafer 40 to form an approximately airtight or watertight state between the base disk portion 31 and the wafer 40 bottom portion to prevent the solution 50 from leaking from a bottom portion of the wafer 40 out of the wafer support disk 30. When the wafer support disk 30 is at the lower wafer separation position, the base disk portion 31 is separated from the wafer 40 bottom portion to eliminate the airtight or watertight state. At this time, the solution 50 can flow below the wafer 40 bottom portion to be discharged by gaps of the wafer support disk 30.

Figure 4:
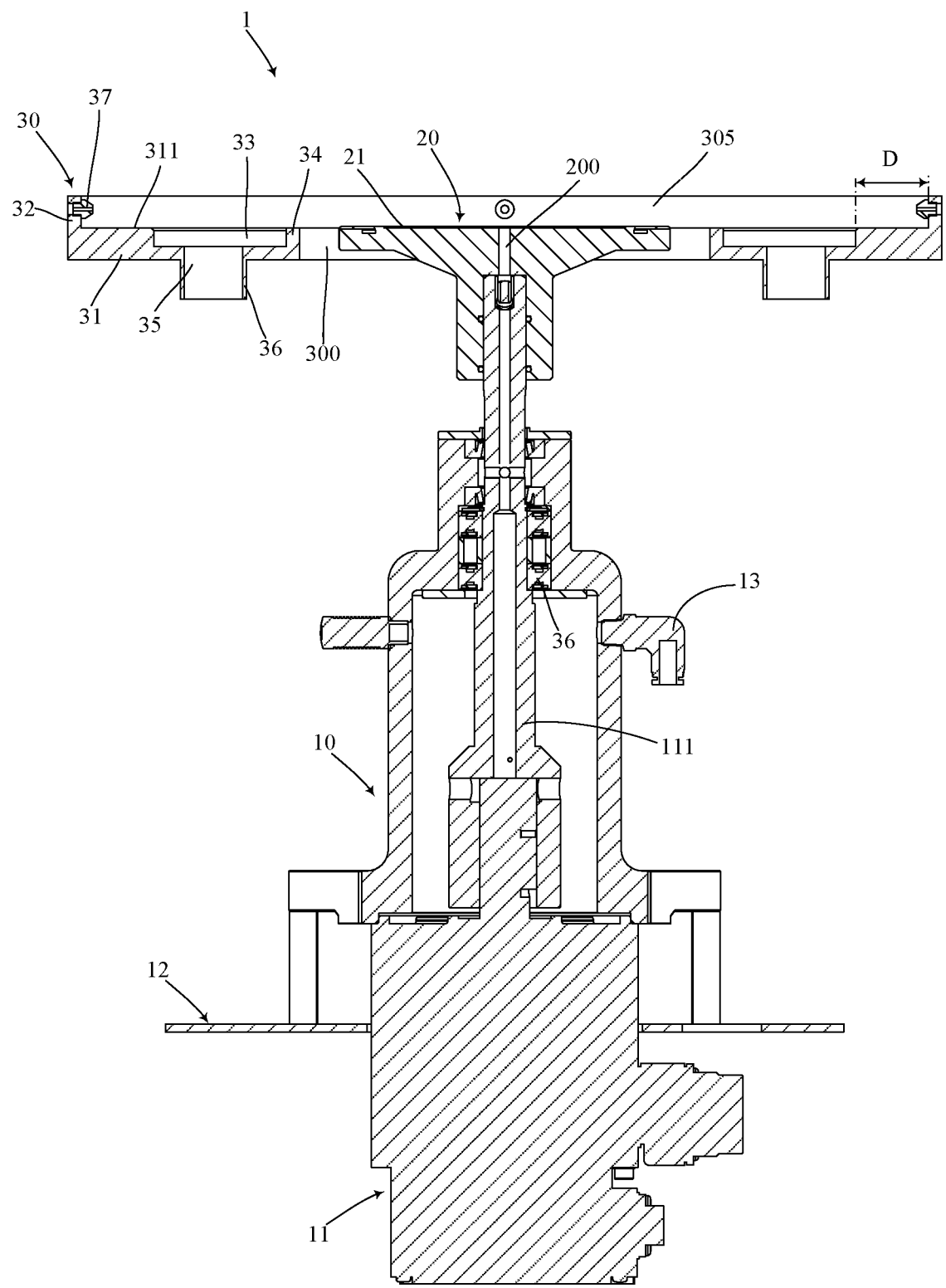
FIG. 4 is a cross-sectional side view of the wafer spin cleaning apparatus of the present invention.
Figure 5:
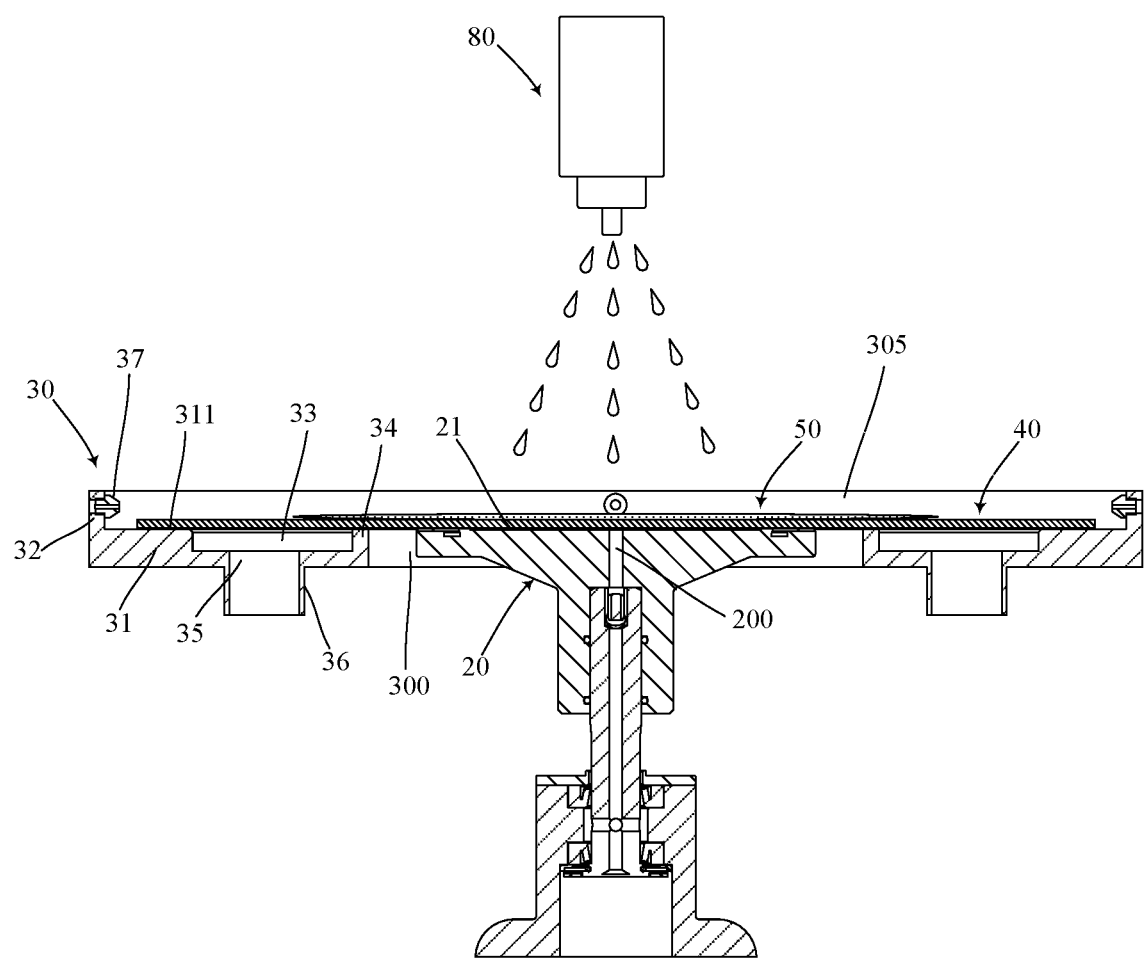
FIG. 5 is a cross-sectional side view of the wafer spin cleaning apparatus of the present invention omitting a motor of a spin driver device, wherein wafer support disk is located at a wafer supporting position.
Figure 6:
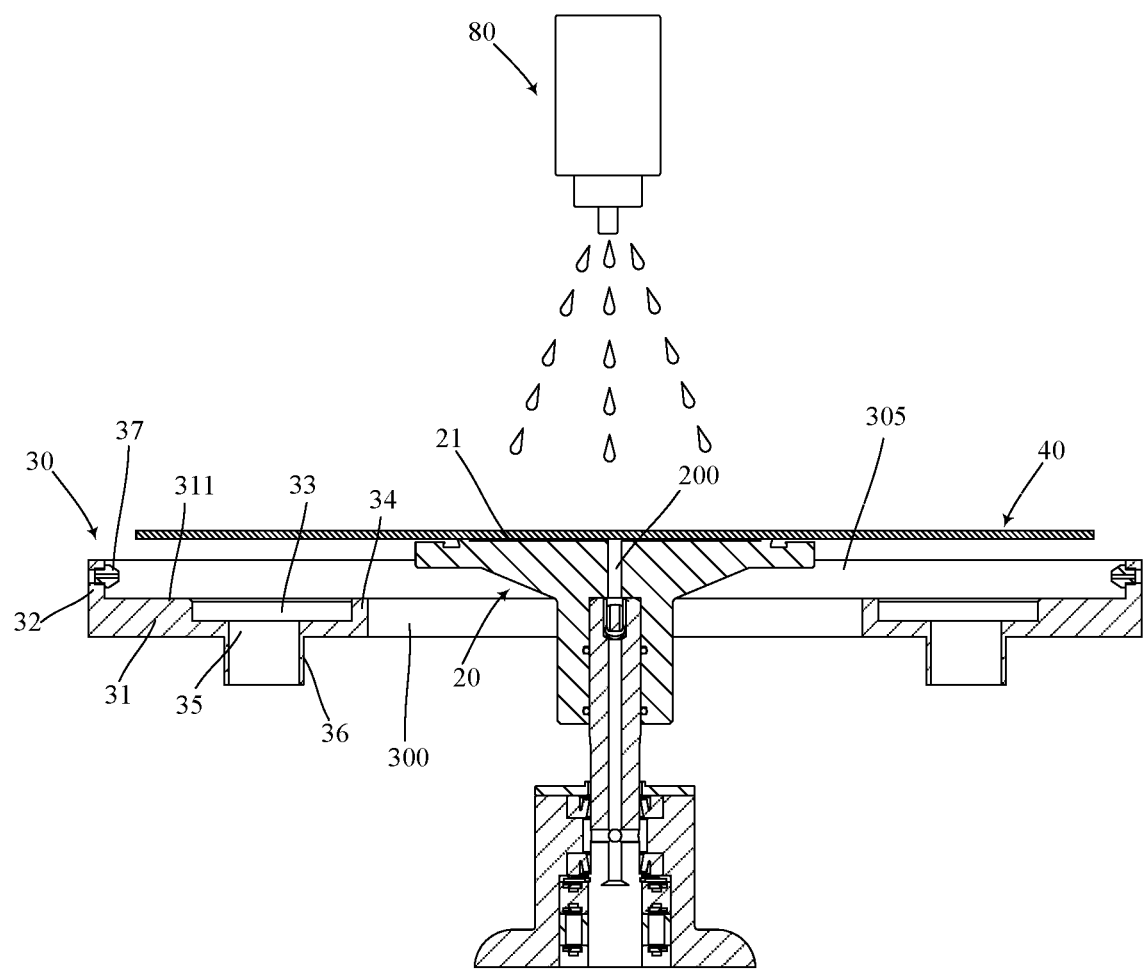
FIG. 6 is another cross-sectional side view of the wafer spin cleaning apparatus of the present invention omitting the motor of the spin driver device, wherein the wafer support disk is located at a wafer separation position.

With further reference to FIGS. 3 and 4, in a preferred embodiment of the present invention, a liquid collection trough 33 is formed in the wafer contact top surface 311 of the base disk portion 31 of the wafer support disk 30. The liquid collection trough 33 is located below the soaking trough 305 and communicates with the soaking trough 305. In a preferred embodiment of the present invention, the liquid collection trough 33 is annular, and an inner annular wall portion 34 is formed on the base disk portion 31 and is located between the liquid collection trough 33 and the accommodation hole 300 to prevent the solution 50 or water from leaking from the liquid collection trough 33 into the accommodation hole 300. Because a bottom of the accommodation hole 300 corresponds to the spin driver device 10 in which a device for collecting water may not be disposed, the inner annular wall portion 34 can effectively prevent the solution 50 or water from accidentally leaking out from the accommodation hole 300. Furthermore, the liquid collection trough 33 can also be multiple liquid collection trough 33 arranged circularly around a periphery of the accommodation hole 300. The liquid collection trough 33 is primarily configured to collect the solution 50 or water applied to the wafer 40 such that the solution 50 or water discharged from the wafer support disk 30 is recycled.

In a preferred embodiment of the present invention, a top end of the inner annular wall portion 34 is flush with the wafer contact top surface 311.

In a preferred embodiment of the present invention, the liquid collection trough 33 and the outer annular wall portion 32 are at an interval D, as shown in FIG. 4. By the interval D, the wafer contact top surface 311 of the base disk portion 31 can have a sufficient area contacting the wafer 40.

In a preferred embodiment of the present invention, at least one liquid discharge hole 35 is formed through the base disk portion 31, communicates with the liquid collection trough 33 and is configured to discharge the solution 50 or water in the liquid collection trough 33.

In a preferred embodiment of the present invention, a discharge pipe 36 is formed on and protrudes from a bottom surface of the base disk portion 31 and corresponds to each liquid discharge hole 35. The discharge pipe 36 can be further connected to an external pipe for discharging the solution 50 or water in the liquid collection trough 33 to a solution recycle device.

In a preferred embodiment of the present invention, the wafer contact top surface 311 of the base disk portion 31 is a flat surface. The flat surface can excellently contact the wafer 40 bottom portion in a large area to approximately form airtight or watertight state to prevent the solution 50 or water from flowing into the liquid collection trough 33 below the wafer 40 before sufficiently reacting with a surface of the wafer 40 to achieve cleaning or etching purpose, which improves efficiency of the wafer process.

In a preferred embodiment of the present invention, a vacuum pump connection port 13 is disposed on the spin driver device 10, and a vacuum suction hole 200 is formed through the wafer spin chuck and communicates with the vacuum pump connection port 13. The vacuum suction hole 200 is configured to secure the wafer on the wafer spin chuck 20.

In a preferred embodiment of the present invention, at least one liquid nozzle 37 is disposed on the outer annular wall portion 32 of the wafer support disk 30 and extends into the soaking trough 305. The liquid nozzle 37 is connected to an external liquid supply device filled with pure water to spray pure water into the soaking trough 305 for washing the wafer support disk 30. Furthermore, the liquid nozzle 37 and the process nozzle 80 are independent devices, and one of the liquid nozzle 37 and the process nozzle 80 can spray the solution 50 or pure water depending on demands of the wafer cleaning and etching process. Alternatively, the liquid nozzle 37 and the process nozzle 80 can spray solutions 50 of different types or pure water in different cleaning steps respectively.

Figure 7:
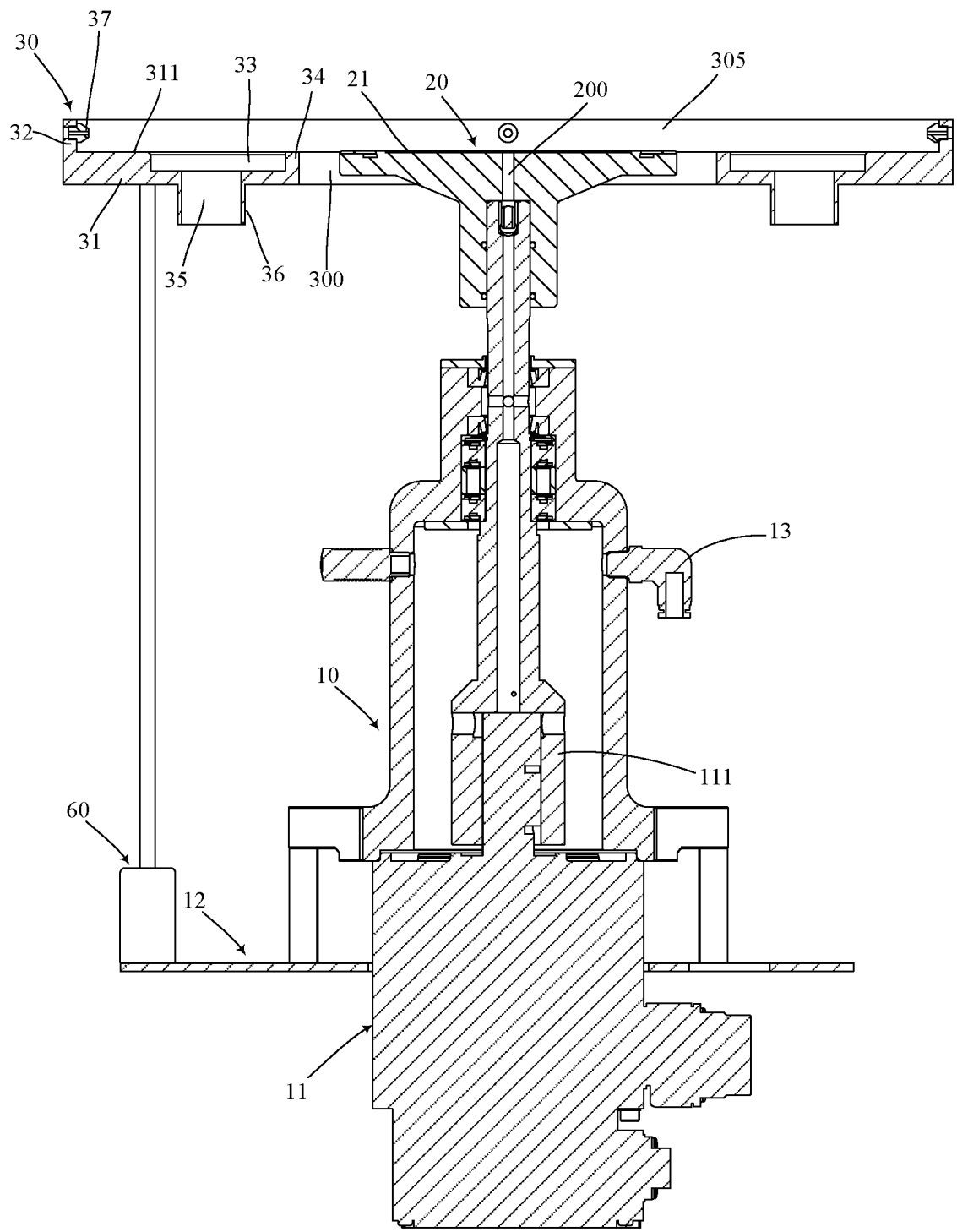
FIG. 7 is a cross-sectional side view of an embodiment of the wafer spin cleaning apparatus of the present invention.

With reference to FIG. 7, in a preferred embodiment of the present invention, the wafer support disk 30 is connected to a lifting drive mechanism 60, and the lifting drive mechanism 60 is configured to drive the wafer support disk 30 to ascend or descend relative to the wafer spin chuck 20.

Figure 8:
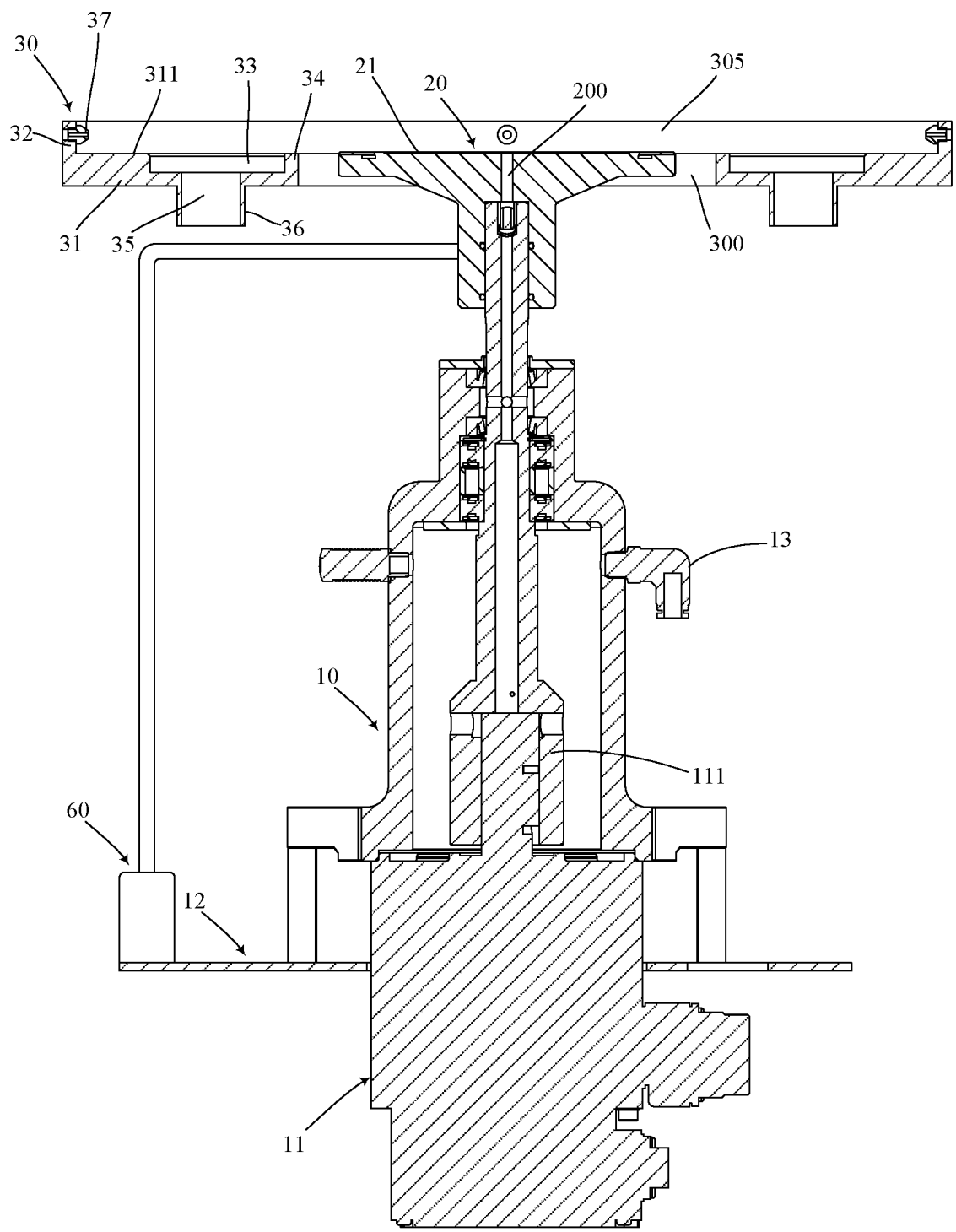
FIG. 8 is a cross-sectional side view of another embodiment of the wafer spin cleaning apparatus of the present invention.

With reference to FIG. 8, in another embodiment of the present invention, the wafer spin chuck 20 is connected to a lifting drive mechanism 60, and the lifting drive mechanism 60 is configured to drive the wafer spin chuck 20 to ascend or descend relative to the wafer support disk 30. At this time, the wafer spin chuck 20 can move upward and downward relative to the spin driver device 10 by a mechanism such as a slider (pneumatic cylinder, telescopic tube, etc.), for example, the wafer spin chuck 20 slided upward and downward by a slider sleeve mounted around a spin shaft of the spin driver device 10. At this time, the wafer support disk 30 by other fastener is secured to the spin driver device 10 or the ground and does not move upward or downward.

In a preferred embodiment of the present invention, the lifting drive mechanism 60 is secured on the spin driver device 10 by a bracket 12, as shown in FIG. 8. Furthermore, in a preferred embodiment of the present invention, the lifting drive mechanism 60 is one of a pneumatic cylinder, a hydraulic cylinder, an electromagnetic valve, and a motor.

In a preferred embodiment of the present invention, the spin driver device 10 comprises a motor 11. The motor 11 is connected to the wafer spin chuck 20 by a spin shaft 111 to be configured to drive the wafer spin chuck 20 to spin. The motor 11 can be a variable speed motor 11 to adjust a speed according to different wafers 40, solutions 50, or processes such that the wafer spin chuck 20 can spin at a suitable speed to achieve a highly efficient solution coating or spin effect.

The present invention single wafer spin cleaning apparatus 1 with soaking, cleaning, and etching functions at least comprises advantages as follows:

1. The single wafer spin cleaning apparatus 1 with soaking, cleaning, and etching functions of the present invention disposes a wafer support disk 30 surrounding a periphery of a wafer spin chuck 20. The wafer support disk 30 is annular and can accommodate a wafer spin chuck 20, an outer edge of the wafer support disk 30 is a protruding outer annular wall portion 32. When the wafer support disk 30 ascends to the wafer supporting position and is at the same level with the wafer spin chuck 20, the wafer support disk 30 exactly tightly supports and surrounds a side surface and a bottom portion of the wafer 40 and makes the wafer 40 seal an accommodation hole in a center of the wafer support disk 30 such that a solution sprayed on the wafer 40 can keep a liquid level in the soaking trough without leaking out from the accommodation hole, and therefore to make the solution to perform a sufficiently soaking effect to the wafer 40 in the soaking trough.

2. After the above soaking step is completed, the wafer support disk 30 can descend to the wafer separation position such that the wafer 40 rises relative to the wafer support disk 30 to make the solution flow into the liquid collection trough of the wafer support disk 30, and is further discharged from the liquid discharge hole. Alternatively, the accommodation hole can also be designed to have liquid guide and drainage effects. After the wafer support disk 30 descends to the wafer separation position, the spin driver device can drive the wafer spin chuck 20 and the wafer secured on the wafer spin chuck 20 by the vacuum suction force to perform later cleaning and spin drying steps to achieve spin cleaning and drying effects to the wafer 40.

3. According to demands of wafer processes, the solution injected from the process nozzle above the wafer 40 onto the wafer 40 in the soaking trough can be a cleaning solution or an etching solution, and can be deionized Water. When the solution is an etching (or a cleaning) solution, the wafer support disk 30 at the wafer supporting position can keep a liquid level of the etching (or a cleaning) solution such that the etching (or a cleaning) solution sufficiently performs the etching (or cleaning) effect. After the etching (or cleaning) step is completed, the wafer support disk 30 descends again to the wafer separation position such that the etching solution can be discharged out from the wafer support disk 30.

4. It is known according to the above three points that the wafer 40 spin cleaning apparatus of the present invention can be performed with continuous single wafer soaking, spin cleaning, etching, and spin drying processes on the same wafer spin chuck 20. Therefore, the present invention can effectively prevent an issue of the above continuous processes requiring a transfer robot to steadily move wafer 40 to independent devices to implement corresponding steps to further simplify wafer cleaning or etching process, reduce the wafer 40 damaging due to frequent wafer 40 transfer, and further improve efficiency and yield of the wafer process.

What is claimed is:

1. A single wafer spin cleaning apparatus with soaking, cleaning, and etching functions, comprising:
    a spin driver device;
    a wafer spin chuck connected to the spin driver device, driven by the spin driver device to spin, and configured to fasten a wafer placed on a top surface of the wafer spin chuck; and
    a wafer support disk, being annular, surrounding an outer side of the wafer spin chuck, and configured to ascend to a wafer supporting position relative to the wafer spin chuck or descend to a wafer separation position relative to the wafer spin chuck, wherein the wafer support disk comprises a base disk portion and an outer annular wall portion protruding out from an outer edge of the base disk portion, a soaking trough is formed between the base disk portion and the outer annular wall portion and is configured to accommodate the wafer, and an accommodation hole is formed through the wafer support disk and communicates with the soaking trough for the wafer spin chuck entering and exiting out of the accommodation hole;
    wherein when the wafer support disk ascends to the wafer supporting position, a wafer contact top surface of the base disk portion is flush with the top surface of the wafer spin chuck; when the wafer support disk descends to the wafer separation position, the wafer contact top surface of the base disk portion is lower than the top surface of the wafer spin chuck;
    wherein a liquid collection trough is formed in the wafer contact top surface of the base disk portion of the wafer support disk, and the liquid collection trough is located below the soaking trough and communicates with the soaking trough;
    wherein the liquid collection trough is annular, and an inner annular wall portion is formed on the base disk portion between the liquid collection trough and the accommodation hole.

2. The wafer spin cleaning apparatus according to claim 1, wherein a top end of the inner annular wall portion is flush with the wafer contact top surface.

3. The wafer spin cleaning apparatus according to claim 1, wherein the liquid collection trough and the outer annular wall portion are at an interval.

4. The wafer spin cleaning apparatus according to claim 1, wherein at least one liquid discharge hole is formed through the base disk portion and communicates with the liquid collection trough.

5. The wafer spin cleaning apparatus according to claim 1, wherein a discharge pipe protrudes from and is formed on a bottom surface of the base disk portion and corresponds to the liquid discharge hole.

6. The wafer spin cleaning apparatus according to claim 1, wherein the wafer contact top surface of the base disk portion is a flat surface.

7. The wafer spin cleaning apparatus according to claim 1, wherein a vacuum pump connection port is disposed on the spin driver device, a vacuum suction hole is formed through the wafer spin chuck and communicates with the vacuum pump connection port, and the vacuum suction hole is configured to secure the wafer on the wafer spin chuck.

8. The wafer spin cleaning apparatus according to claim 1, wherein at least one liquid nozzle is disposed on the outer annular wall portion of the wafer support disk and extends into the soaking trough.

9. The wafer spin cleaning apparatus according to claim 1, wherein the wafer support disk is connected to a lifting drive mechanism, and the lifting drive mechanism is configured to drive the wafer support disk to ascend or descend relative to the wafer spin chuck.

10. The wafer spin cleaning apparatus according to claim 1, wherein the wafer spin chuck is connected to a lifting drive mechanism, and the lifting drive mechanism is configured to drive the wafer spin chuck relative to the wafer support disk.

11. The wafer spin cleaning apparatus according to claim 9, wherein the lifting drive mechanism is secured on the spin driver device.

12. The wafer spin cleaning apparatus according to claim 9, wherein the lifting drive mechanism is one of a pneumatic cylinder, a hydraulic cylinder, an electromagnetic valve, and a motor.

13. The wafer spin cleaning apparatus according to claim 1, wherein the spin driver device comprises a motor, the motor is connected to the wafer spin chuck by a spin shaft and is configured to drive the wafer spin chuck to spin.

14. A single wafer spin cleaning apparatus with soaking, cleaning, and etching functions, comprising:
    a spin driver device;
    a wafer spin chuck connected to the spin driver device, driven by the spin driver device to spin, and configured to fasten a wafer placed on a top surface of the wafer spin chuck; and a wafer support disk, being annular, surrounding an outer side of the wafer spin chuck, and configured to ascend to a wafer supporting position relative to the wafer spin chuck or descend to a wafer separation position relative to the wafer spin chuck, wherein the wafer support disk comprises a base disk portion and an outer annular wall portion protruding out from an outer edge of the base disk portion, a soaking trough is formed between the base disk portion and the outer annular wall portion and is configured to accommodate the wafer, and an accommodation hole is formed through the wafer support disk and communicate with the soaking trough for the wafer spin chuck entering and exiting out of the accommodation hole;

wherein when the wafer support disk ascends to the wafer supporting position, a wafer contact top surface of the base disk portion is flush with the top surface of the wafer spin chuck; when the wafer support disk descends to the wafer separation position, the wafer contact top surface of the base disk portion is lower than the top surface of the wafer spin chuck;

wherein a liquid collection trough is formed in the wafer contact top surface of the base disk portion of the wafer support disk, and the liquid collection trough is located below the soaking trough and communicates with the soaking trough;

wherein the spin driver device comprises a motor, the motor is connected to the wafer spin chuck by a spin shaft and is configured to drive the wafer spin chuck to spin.

* * * * *

UNITED STATES PATENT AND TRADEMARK OFFICE
CERTIFICATE OF CORRECTION

PATENT NO. : 12,387,970 B2
APPLICATION NO. : 18/104976
DATED : August 12, 2025
INVENTOR(S) : Li-tso Huang et al.

Page 1 of 1

It is certified that error appears in the above-identified patent and that said Letters Patent is hereby corrected as shown below:

On the Title Page

The corrected item (73) Assignee Name is:
GRAND PROCESS TECHNOLOGY CORP.

Signed and Sealed this
Ninth Day of September, 2025

Coke Morgan Stewart
*Acting Director of the United States Patent and Trademark Office*